United States Patent
Kroll et al.

(10) Patent No.: US 7,390,731 B2
(45) Date of Patent: Jun. 24, 2008

(54) METHOD OF DEPOSITING AN OXIDE LAYER ON A SUBSTRATE AND A PHOTOVOLTAIC CELL USING SAID SUBSTRATE

(75) Inventors: Ulrich Kroll, Corcelles (CH); Johannes Meier, Corcelles (CH)

(73) Assignee: Universite de Neuchatel, Institut de Microtechnique, Neuchatel (CH)

( * ) Notice: Subject to any disclaimer, the term of this patent is extended or adjusted under 35 U.S.C. 154(b) by 365 days.

(21) Appl. No.: 10/488,174

(22) PCT Filed: Aug. 23, 2002

(86) PCT No.: PCT/CH02/00458
§ 371 (c)(1),
(2), (4) Date: Jun. 24, 2004

(87) PCT Pub. No.: WO03/021690
PCT Pub. Date: Mar. 13, 2003

(65) Prior Publication Data
US 2004/0235286 A1    Nov. 25, 2004

(30) Foreign Application Priority Data
Aug. 30, 2001  (EP)  ................................... 01810840

(51) Int. Cl.
*H01L 21/44*  (2006.01)
(52) U.S. Cl. ............... 438/608; 438/609; 427/126.3; 427/584; 205/140; 205/141
(58) Field of Classification Search ............ 438/87, 438/608, 609; 118/726; 257/E21.17; 427/126.3, 427/584; 205/140, 141
See application file for complete search history.

(56) References Cited

U.S. PATENT DOCUMENTS

| | | | |
|---|---|---|---|
| 4,513,057 A | 4/1985 | Peters | 428/336 |
| 4,605,565 A | 8/1986 | Nath | 427/576 |
| 4,724,159 A | 2/1988 | Yamazaki | 427/568 |
| 4,751,149 A | 6/1988 | Vijayakumar | 428/702 |
| 4,990,286 A | 2/1991 | Gordon | 252/519.14 |
| 5,002,796 A | 3/1991 | Nishida | 427/573 |
| 5,252,140 A | 10/1993 | Kobayashi et al. | |
| 5,397,920 A * | 3/1995 | Tran | 257/749 |
| 5,711,816 A * | 1/1998 | Kirlin et al. | 118/726 |
| 6,096,389 A * | 8/2000 | Kanai | 427/575 |
| 6,309,906 B1 | 10/2001 | Meier | 438/69 |

FOREIGN PATENT DOCUMENTS
EP    96934294.8    10/1998

* cited by examiner

*Primary Examiner*—Hsien-ming Lee
(74) *Attorney, Agent, or Firm*—Townsend M. Belser, Jr.; Nexsen Pruet, LLC

(57) ABSTRACT

The process according to the invention makes it possible to deposit a transparent conductive oxide film on a toughened glass substrate placed inside a chamber. It consists in providing sources containing an oxygen-based liquid compound, a liquid compound of the metal intended to form the oxide, and a dopant in gaseous or liquid form, respectively; establishing a temperature between 130 and 300° C. and a pressure between 0.01 and 2 mbar in the chamber; and then bringing said sources into communication with the chamber, which has the effect of vaporizing the liquids at their surface, of drawing them up into the chamber without having to use a carrier gas, and of making them react therein with the dopant so that the oxide layer is formed on the substrate.

5 Claims, 1 Drawing Sheet

Figure 1:
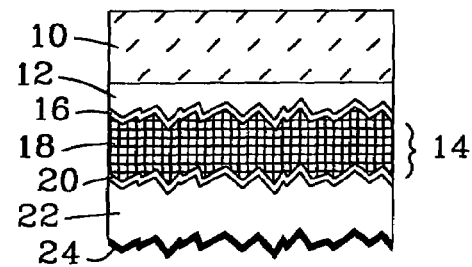

METHOD OF DEPOSITING AN OXIDE LAYER ON A SUBSTRATE AND A PHOTOVOLTAIC CELL USING SAID SUBSTRATE

The present invention relates to a process for depositing a transparent oxide film on a substrate, which is particularly applicable to the manufacture of a photovoltaic cell, also called a solar cell. The invention also relates to such a cell, the transparent oxide film of which is deposited using this process.

At the present time, the most technologically advanced solar cells comprise a substrate, a TCO (transparent conductive oxide) film deposited on the substrate and a photovoltaically active film deposited on the oxide film. This photosensitive film is advantageously composed of three sublayers of amorphous, microcrystalline or nanocrystalline hydrogenated silicon forming a p-i-n junction. More precisely, the two outer sublayers are positively and negatively doped, respectively, whereas the intermediate sublayer is intrinsic.

A cell of this type is described in detail, for example, in several embodiments, in the application EP 96934294.8.

In the current state of the art, photovoltaic cells generally use a transparent conductive oxide film made of tin dioxide ($SnO_2$) or zinc oxide (ZnO) deposited on a glass substrate by the known process of CVD (chemical vapor deposition), which is carried out at a temperature generally between 400 and 550° C.

However, it is particularly beneficial to be able to deposit the oxide film at a lower temperature, as this would allow the use of a substrate such as toughened glass, which meets the required safety standards for an outdoor application.

Unfortunately, the abovementioned temperatures have the effect of impairing the properties of the substrate that have been conferred on it by the toughening operation.

U.S. Pat. No. 5,252,140 discloses a solar cell on toughened glass, in which the toughening is carried out after the oxide film has been formed. To prevent the film from degrading, the heating is carried out at a maximum of 650° C. for less than two minutes, followed by rapid cooling in air. However, these precautions make the process more expensive and do not ensure the quality of the toughening.

At the present time, manufacturers must therefore generally be content with solar cells on untoughened glass, which are relatively brittle and pose a major potential hazard as they can break into sharp fragments. Their use in dwellings is thus limited, or even prohibited in the case of curtain walling.

U.S. Pat. Nos. 4,751,149 and 5,002,796 disclose processes for depositing the oxide film in the vapor phase, in which the chemical compounds participating in the reaction are brought into the chamber via a carrier gas saturated with these compounds by sparging.

Admittedly, such a method does mean that the reaction conditions are more gentle, since they do not impair the properties of the substrate, which therefore can be used, in particular, for the production of solar cells on toughened glass. However, the method does not allow the quantity of reactants involved to be properly controlled, since the thermodynamic equilibrium that governs the saturation threshold of the carrier gas depends strongly on the temperature and on the flow rate of this gas. Since there is a problem in keeping a precise temperature throughout the entire circuit, there is therefore a risk of uncontrolled recondensation of the reactants at a cooler point in the plant. The uniformity and reproducibility of the film are consequently rather difficult to ensure.

It is an object of the present invention to provide a deposition process allowing not only the use of a substrate made of toughened glass or any other material poorly resistant to high temperatures (above 300° C.), but also precise control of the quantity of reactants involved, since the experimental conditions within the feed circuit are sufficient to avoid any inopportune recondensation.

More precisely, the invention relates to a process for depositing a transparent conductive oxide film on a substrate placed inside a chamber, characterized in that it consists in:
  providing sources containing an oxygen-based liquid compound, a liquid compound of the metal intended to form the oxide, and a dopant in gaseous or liquid form, respectively;
  establishing a temperature between 130 and 300° C. and a pressure between 0.01 and 2 mbar in the chamber; and then
  bringing said sources into communication with the chamber, which has the effect of vaporizing the liquids at their surface, of drawing them up into the chamber without having to use a carrier gas, and of making them react therein with the dopant so that the oxide layer is formed on the substrate.

According to the invention, when the abovementioned temperatures are too low to allow the chemical reactions resulting in the formation of the oxide, the chemical vaporization takes place in a plasma of the deposition gases, formed inside the chamber, preferably using the technique called PECVD (plasma-enhanced chemical vapor deposition), well known to those skilled in the art.

The invention also relates to a photovoltaic cell, characterized in that it comprises:
  a substrate;
  a transparent conductive oxide film deposited on the substrate by the process defined above; and
  a photovoltaically active film deposited on the oxide film.

Advantageously, the active film of the cell comprises three sublayers of amorphous, microcrystalline or nanocrystalline hydrogenated silicon forming a p-i-n junction, the two outer sublayers being positively and negatively doped, respectively.

Advantageously, the substrate is made of glass, preferably toughened glass, but it may also be made of stainless steel, aluminum or a polymer.

Figure 2:
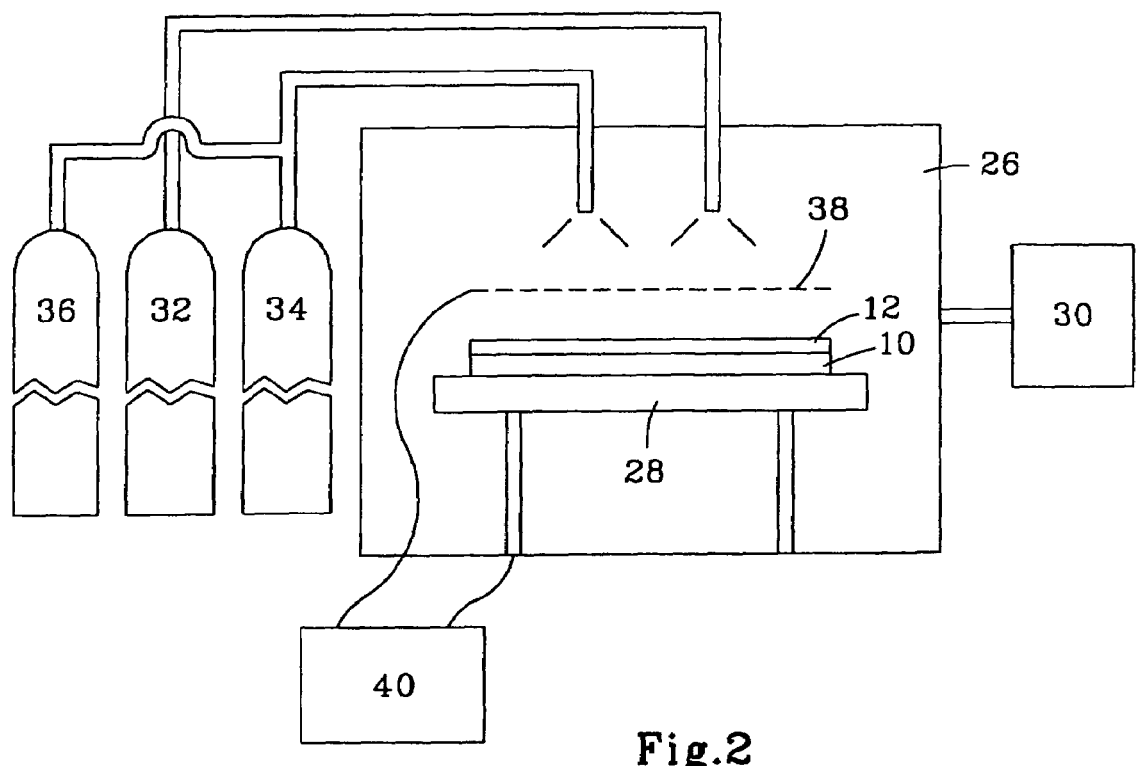

Other features of the invention will become apparent from the description that follows, given in conjunction with the appended drawing in which:
  FIG. 1 is a sectional view of a cell according to the invention; and
  FIG. 2 shows schematically a plant for manufacturing this cell.

The cell shown in FIG. 1 uses, as substrate 10, a thin plate of toughened glass, having a thickness of around 1 to 8 mm, on which a transparent conductive oxide (TCO) film 12 has been deposited with, typically, a thickness of 0.2 to 4 μm.

The layer 12, advantageously made of tin dioxide ($SnO_2$), zinc oxide (ZnO) or a tin zinc oxide, is deposited by chemical vapor deposition (CVD) using a process that will be described later.

A photovoltaically active film 14, with a thickness of about 0.2 to 10 μm, is deposited on the oxide film 12. It is composed of three sublayers of amorphous, microcrystalline or nanocrystalline hydrogenated silicon 16, 18 and 20, forming a p-i-n junction. The two outer sublayers 16 and 20 are positively and negatively doped, respectively.

Finally, the cell also includes a rear contact film 22, for example made of zinc oxide, deposited on the active film 14, and a reflecting film 24, for example made of silver or aluminum, deposited on the film 22.

Other cell structures, using especially an n-i-p junction, may be produced on the same toughened glass substrate and the same transparent oxide film. They are described in detail in the EP document mentioned above.

Referring now to FIG. 2, this shows the plant for the CVD deposition of a zinc oxide film 12 on the toughened glass plate 10. This figure shows, at 26, a sealed chamber provided with a heated support 28 on which the toughened glass plate is laid. The chamber 26 is connected to a vacuum pump 30 and to three containers 32, 34 and 36 which contain, firstly, water, secondly, diethylzinc $(C_2H_5)_2Zn$ and, thirdly, a dopant, advantageously in the form of diborane $(B_2H_6)$. Of course, other compounds based on zinc and other dopants, all well known to those skilled in the art, may be used. The contents of the two containers 32 and 34 are liquids, whereas that of the container 36 is a gas mixture containing 0.5 to 2% diborane diluted in a gas such as nitrogen, argon or hydrogen. It should be noted that the containers 32 and 34 are connected directly to the chamber. The container 36 is firstly connected to the delivery line of the container 34, but it may also be connected directly to the chamber.

In operation, the chamber 26 is taken, using the heated support 28, to a temperature of about 180° C., but which may be between 130 and 300° C., while the pump 30 lowers the pressure to a value of 0.3 to 0.5 mbar, but which may be between 0.01 and 20 mbar. The adjustable valves (not shown) connecting the containers 32, 34 and 36 to the chamber 26 are then opened. Because of the very low pressure established in the chamber, and therefore in the containers, the diethylzinc and the water that are contained in these containers in the liquid state evaporate at their surface and the resulting gases, drawn up into the chamber, react together and with the dopant gas $(B_2H_6)$ in order to deposit, at the temperature of the substrate, according to a known reaction, the desired zinc oxide film 12 on the toughened glass plate 10.

Since the operation is carried out at a relatively low temperature, the toughened glass undergoes no deterioration of its properties. Moreover, owing to the uniform and low pressure within the plant, there is no risk of the vaporized gases recondensing before their entry into the chamber.

The above process is perfectly suited for depositing diborane-doped zinc oxide, since the chemical reactions involved pose no problem at the temperatures mentioned. In contrast, when tin dioxide or zinc oxide are deposited by CVD with a more stable dopant, such as methyl tetrafluoride $(CF_4)$, these temperatures are too low for the reactions to normally take place.

According to the invention, the oxide film is then deposited by the plasma-enhanced chemical vapor deposition or PECVD process. In this case, the chamber 26 is equipped with an electrode, for example in the form of a grid 38, placed above the heated support 28, and an electrical generator 40 is connected between this electrode and the support.

Thus, in operation, although the temperature and the pressure are maintained at the abovementioned values, the gases introduced into the chamber 26 give rise to the formation of a plasma between the electrode 38 and the support 28. Active radicals are thus generated by the plasma and allow the chemical reactions giving rise to the oxide film coating to take place at a substantially lower temperature than that normally necessary, thus preserving the properties of the substrate.

Advantageously, to obtain the desired $SnO_2$ coating, the containers 34 and 36 contain, for example, tetramethyltin $(CH_3)_4Sn$ and, as dopant, methyl tetrafluoride $(CF_4)$, respectively. It goes without saying that other compounds, well known in the art, may be used.

It will be noted that the water in the container 32 may be replaced with any oxygen-containing compound $(N_2O, CH_3OH, C_2H_5OH, \ldots)$ and the dopant contained in the container 36 may also be in liquid form.

The present description has been given with reference to a toughened glass substrate, as one application of this is particularly beneficial in the case of curtain walling, but it goes without saying that other substrates, such as normal glass, stainless steel, aluminum or polymers, etc., may be used within the context of the invention.

The invention claimed is:

1. A process for depositing a transparent conductive oxide film on a substrate placed inside a chamber, said process comprising:
    providing sources containing an oxygen-based liquid compound, a liquid compound of the metal intended to form the transparent conductive oxide film, and a dopant in gaseous or liquid form;
    establishing a temperature between 130 and 300° C. and a pressure between 0.01 and 2 mbar in said chamber; and then
    bringing said sources into direct communication with said chamber, which has the effect of vaporizing said oxygen-based liquid compound, said liquid compound of the metal, and said dopant if the source of dopant is in liquid form at their surface, of drawing said vaporized compounds and said vaporized or gaseous form dopant up into the chamber without having to use a carrier gas, and of making said vaporized oxygen-based compound and said vaporized compound of the metal react therein with the dopant so that said oxide film is formed on the substrate.

2. The process as claimed in claim 1, for depositing a film of zinc oxide, wherein said sources contain water, diethylzinc in liquid form and a diborane-based gas mixture.

3. The process as claimed in claim 1, further comprising forming a plasma of said vaporized oxygen-based liquid compound, said vaporized liquid compound of the metal and said vaporized dopant inside the chamber.

4. The process as claimed in claim 3, for depositing a film of tin oxide, wherein said sources contain water, tetramethyltin in liquid form and a gas mixture based on methyl tetrafluoride.

5. The process as claimed in claim 3, for depositing a film of zinc oxide, wherein said sources contain water, diethylzinc in liquid form and a gas mixture based on methyl tetrafluoride.

* * * * *